United States Patent
Ho et al.

(10) Patent No.: US 6,928,402 B2
(45) Date of Patent: Aug. 9, 2005

(54) METHOD TO SUPPORT THE SETUP OF INPUT PARAMETERS

(75) Inventors: Shirun Ho, Tokyo (JP); Miyuki Saji, Kokubunji (JP); Sigeo Ihara, Tokorozawa (JP); Satoshi Ito, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 763 days.

(21) Appl. No.: 09/748,390

(22) Filed: Dec. 27, 2000

(65) Prior Publication Data

US 2002/0010565 A1 Jan. 24, 2002

(30) Foreign Application Priority Data

Dec. 28, 1999 (JP) .......................................... 11-373984

(51) Int. Cl.$^7$ ................................................ G06F 9/45
(52) U.S. Cl. ........................................ 703/22; 700/31
(58) Field of Search ............................... 703/22, 2, 13, 703/15, 17; 700/31, 97

(56) References Cited

U.S. PATENT DOCUMENTS 5,544,348 A * 8/1996 Umeda et al. ................. 703/17
6,035,115 A * 3/2000 Suzuki .......................... 703/15
6,353,768 B1 * 3/2002 Karafillis et al. .............. 700/97
6,366,822 B1 * 4/2002 Heavlin ........................ 700/31

* cited by examiner

*Primary Examiner*—Albert W. Paladini
(74) *Attorney, Agent, or Firm*—Mattingly, Stanger, Malur & Brundidge, P.C.

(57) ABSTRACT

Values of input parameters are set. Simulations are executed in parallel for individual sets of input parameters by a plurality of processors to obtain design values which are execution results. The obtained design values are compared with the design condition. Directory files are constructed for plural kinds of input parameters corresponding to design values satisfying the design condition. Accumulative distribution in the distribution of parameter input values are determined in respect of the individual kinds of input parameters. Input values of parameters to be referred are extracted on the basis of values of the accumulative distribution every kind of input parameter. The kind of input parameter, the extracted input values and the number of the extracted input values are displayed through an input interface every kind of input parameter.

4 Claims, 11 Drawing Sheets

FIG. 3

| INPUT PARAMETERS ||||
|---|---|---|---|
| ITEMS | REFERENCE VALUES | NUMBER OF INPUTS | INPUT VALUES |
| Pb | Pb1 | 1 | Pb1 |
| Pc | Pc1,Pc2 | 2 | Pc1,Pc2 |
| Pm | Pm1,Pm3 | 2 | Pm1,Pm3 |
| ⋮ | ⋮ | ⋮ | ⋮ |
| Pa | Pa1,Pa2,⋯,PaN | ARBITRARY | $Pa\alpha, Pa\beta$ |

A PLAINER STRUCTURE OF AC-PDP

A CELL STRUCTURE FOR ANALYSING SUSTEIN DISCHARGE

FIG. 11
PARAMETER SET SATISFIED CONDITIONS
| INPUT PARAMETER UNIT($\mu$m) | | | | | | | | | |
|---|---|---|---|---|---|---|---|---|---|
| ITEMS | 1 | 2 | 3 | 4 | ⑤ | 6 | ⑦ | ⑧ | ........ |
| Lg | 40 | 40 | 50 | 50 | 60 | 60 | 70 | 70 | |
| Wxy | 100 | 100 | 100 | 100 | 150 | 150 | 150 | 150 | |
| Lfd | 10 | 20 | 30 | 10 | 20 | 10 | 30 | 40 | ........ |
| Lp | 10 | 20 | 30 | 20 | 20 | 30 | 40 | 10 | |
| Lbd | 10 | 20 | 30 | 30 | 30 | 20 | 20 | 10 | |
| MEASUREMENTS (%) | 50 | 40 | 20 | 10 | 60 | 50 | 70 | 60 | ........ |
FIG. 12
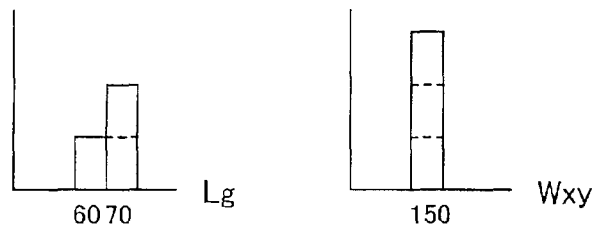
DENSE IN PARAMETER VALUES (DENSE ACCUMULATION)
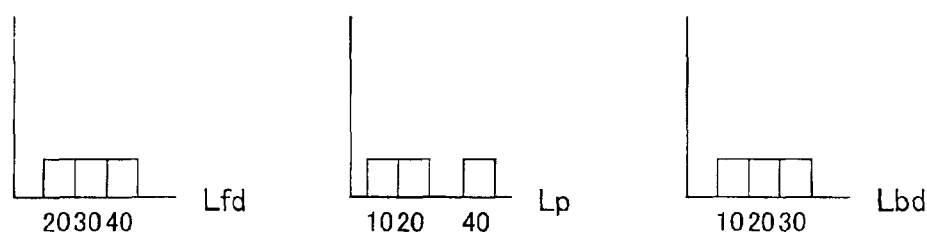
LOOSE IN PARAMETER VALUES (LOOSE ACCUMULATION)

FIG. 13

| INPUT PARAMETERS | | | |
|---|---|---|---|
| ITEMS | REFERENCE VALUES | NUMBER OF INPUTS | INPUT VALUES |
| Wxy | 150 | 1 | 150 |
| Lg | 60,70 | 2 | 65 |
| Lfd | 20,30,40 | ARBITRARY | 10,20,30,40 |
| Lp | 10,20,40 | ARBITRARY | 10,20,30,40 |
| Lbd | 10,20,30 | ARBITRARY | 10,20,30,40 |

METHOD TO SUPPORT THE SETUP OF INPUT PARAMETERS

BACKGROUND OF THE INVENTION

The present invention relates to a simulator or a CAD (Computer Aided Design) system utilized for product design in a variety of scientific technological fields such as design of semiconductor devices, integrated circuits and magnetic storage devices. More particularly, the present invention relates to a method for executing a parameter survey based on simulation to realize optimum product design and a reduction in product design schedule.

In many applications of the product design, a series of working operations of setting parameters representing design objects, making a prototype of a product actually on trial, and evaluating the performance of the product are repeated in a trial and error fashion.

As shown in FIG. 7, values of parameters (Pa, Pb, ..., Pm) are set on the basis of the past experimental results and experiences in block 701, and a prototype of a product is actually manufactured for trial in accordance with the parameters.

For example, the prototype of the product is manufactured on trial in accordance with parameter 1 (Pa1, Pb1, ..., Pm1), parameter 2 (Pa1, Pb1, ..., Pm3), ......, parameter 4 (Pa4, Pb1, , Pm1), ....

Next, in block 702, the performance of the product manufactured for trial in accordance with the individual parameters is measured to obtain experimental results (D1, D2, D3, D4, ...) in block 703. Here, D1 indicates the experimental result for the product according to parameter 1. Similarly, this holds true for D2 and so forth.

One or more experimental results satisfying design condition 704 are selected from the experimental results 703, and the selected experimental results are set as design values.

In block 705, design value D2 (Pa1, Pb1, ..., Pm3) and design value D4 (Pa4, Pb1, ..., Pm1) are obtained.

If any experimental results satisfying the design condition cannot be obtained, the values of parameters representing design objects are newly set again, the product is manufactured for trial again, and the measurement is conducted. This procedure is repeated until the design values satisfying the design condition can be obtained.

In this simple design flow, since the kind and number of parameters representing design objects are infinite, much time and efforts are needed and high costs are incurred.

As a method for reduction of iteration time of trial manufacture, it is proposed to add disturbance in Taguchi method in order to evaluate the function (Nikkei Mechanical, Feb. 19, 1996, No. 474, pp. 30–33), for example.

According to Taguchi method, the kinds of parameters are separated into control parameters which can actually be controlled and designed, and error parameters which cannot be controlled.

In the control parameters, a set of the minimum number of parameters is set using cross tables utilized in the statistic method.

For example, 18 sets of cross tables are recommended to reduce the number of parameters.

Next, a product is actually manufactured on trial using the sets of the minimum number of parameters according to the cross tables, and the S/N ratio and sensitivity are measured as characteristics of the trial product.

In the procedure of setting the values of parameters, a set of parameters with high S/N ratio is first selected, and then a set of parameters with high sensitivity is selected. Thereby, a product with a highly stability is designed.

In the error parameters, however, a great number of combinations, being equal in number to the kind and number of parameters, take place.

Thus, the trial manufacture and measurement must be repeated such a great number of times. Accordingly, the number of trial manufactures must further be reduced to overcome the problem of high costs.

Under the circumstances, a method for parallel parameter survey has been proposed (JP-A-11-338829 entitled "Job and Data Managing Method"). In this method, simulation is executed on a parallel machine or on a numerical value operation unit of work station cluster to simultaneously calculate values of parameters representing design objects on individual processors.

A user sets values of parameters in material and structure modeling, physical modeling, numerical value experiment modeling of numerical value calculation method and so forth through an input display unit which includes a mouse, a keyboard, a display and so forth.

Based on the values of these input parameters, a computer comprised of a CPU (Central Processing Unit), memories and a network executes an operation process based on a simulation program.

The execution results of the simulation are output to an output display unit such as a display in a data or graphical form to support the user in product design.

To describe the above method more specifically by making reference to FIG. 8, values of input parameters (Pa, Pb, ..., Pm) representing design objects are set in block 801, the values of the individual input parameters are simultaneously executed in parallel on the individual processors of the parallel machine or work station cluster connected to the network in block 802 instead of sequentially executing the simulation, and simulation results (D1, D2, D3, D4, ..., Dk) are obtained at a high speed by the number of processors in block 803.

If the simulation execution results 803 do not satisfy design condition 804, the parameters are set again in block 801, and the parallel parameter survey is repetitively executed in block 802 until design value D1 (Pa1, Pb3, ..., Pm4) and design value D3 (Pa4, Pb2, ..., Pm2) satisfying the design condition 804 can be obtained in block 805.

The above parallel parameter survey method can reduce the iteration time of actual trial manufacture to a great extent to solve the problem of high costs, and can reduce the time required for simulation calculation by the number of processors.

In recent years, user's needs have been diversified more and more, and reduction of development cycle of products and earlier bringing products to market are indispensable for assuring high profit ratios.

To this end, in the product design based on simulation, reduction of the kind and number of input parameters representing design objects is indispensable.

For example, when there are four kinds of input parameters and there are four recommended parameter values for the individual input parameters in block 802 in FIG. 8, a set of 256 (=$4^4$) parameters take place, and time required for calculation in simulation increases very drastically even when the parallel parameter survey method is employed.

Further, as the kind of input parameter and the number of input values of parameters increase, setting of the values of input parameters must be repeated through the manual working operation. Therefore, there is a high possibility that the input values of parameters are mistaken owing to artificial mistakes.

In addition, it is very difficult for a user and customer to change from the conventionally accustomed product design based on trial manufacture to the product design based on the simulation using the parameter survey.

There needs guidance to how to combine the conventional experimental results and analytical results with the execution results of simulation, and how to search the values of parameters satisfying the design condition.

Build-up for quickly and smoothly changing to the product design based on the simulation must be supported.

Accordingly, it is important in the product design based on the simulation to provide a framework of product design in which the kind and number of input parameters representing design objects can be reduced to a great extent, artificial mistakes of input values of parameters due to manual working operations can be prevented, and the simulation permitting optimum design at low costs and at high speeds can be used in place of the actual trial manufacture while using the conventional experimental results and the results of the simulation in combination.

It is desirable that the optimum design of products is drastically accelerated by preparing a virtual design database in which values of input parameters and results of simulation are stored by building-up this simulation framework rapidly.

For example, realization of a simulation framework for quality improvement design can be expected in which the sensitivity and correlation coefficients of the operation margin relative to the process margin can be calculated, the yield of products can be built up rapidly, and the time for countermeasures against defective design can be reduced.

SUMMARY OF THE INVENTION

An object of the present invention is to reduce the kind and number of input parameters representing design objects to a great extent in product design based on simulation, and to prevent, through this reduction, artificial mistakes of input values of parameters due to manual working operations.

Another object of the present invention is to permit inexpensive and high-speed optimum design of products in place of the conventional actual trial manufacture.

To accomplish the above objects, the present invention provides an input-parameter setup supporting method for a simulation framework in which:

values of plural kinds of input parameters are set from an input display unit;

simulation is executed on a processing unit; and design values which are execution results of the simulation are output using an output display unit, wherein the processing unit for performing the input-parameter setup supporting comprises the steps of:

receiving the individual design values which are the execution results, and the plural kinds of input parameters corresponding to the individual design values;

for the plural kinds of input parameters corresponding to design values which satisfy one or more design conditions, among the design values obtained through the simulation, obtaining accumulative distribution in distribution of input values of parameters every kind of input parameter, and extracting the input values of parameters to be referred, every kind of input parameter based on a value of the accumulative distribution;

displaying by an input interface the kind of input parameter, the extracted input values, and the number of the extracted input values every kind of input parameter; and permitting a user to set values of the plural kinds of input parameters from the input display unit by referring to the display.

When it is determined that the accumulative distribution for the input value of one parameter in a certain kind of input parameters is isolatively larger than the accumulative distribution for the input values of the other parameters, the input values of parameters in the certain kind of input parameters are fixed to the input value of the one parameter, and a display concerning the certain kind of input parameters is excluded from the display on the input interface.

Directories of files corresponding to the input values of parameters are constructed, and a file for storing the design values which are execution results of the simulation corresponding to the individual directories and the plural kinds of input parameters corresponding to the design values is constructed under a hierarchical structure of the directories.

Further, the present invention provides an input-parameter setup supporting method for a simulation framework in which:

plural sets of values of plural kinds of input parameters are set from an input display unit;

simulations for the individual sets are executed in parallel in a plurality of processing units connected through a network; and design values which are execution results of the simulations are output using an output display unit, wherein the processing unit for performing the input-parameter setup supporting comprises the steps of:

receiving the individual design values which are the execution results, and the plural kinds of input parameters corresponding to the individual design values;

for the plural kinds of input parameters corresponding to design values which satisfy one or more design conditions, among the design values obtained through the simulations, obtaining accumulative distribution in distribution of input values of input parameters every kind of input parameter, and extracting the input values of parameters to be referred, every kind of input parameter based on a value of the accumulative distribution;

displaying by an input interface the kind of input parameter, the extracted input values, and the number of the extracted input values every kind of input parameter; and permitting a user to set the values of the plural kinds of input parameters from the input display unit by referring to the display.

Other design values obtained as existing experimental results and other plural kinds of input parameters corresponding to the other design values are used in combination with the design values obtained through the simulations and the plural kinds of input parameters corresponding to the design values.

BRIEF DESCRIPTION OF THE DRAWINGS

FIG. 3 is a diagram showing an input interface for parameters.

FIG. 11 is a diagram showing the result of parallel parameter survey.

FIG. 12 is a diagram showing the distribution of input values of parameters.

FIG. 13 is a diagram showing a GUI screen concerning input parameters.

DESCRIPTION OF THE EMBODIMENTS

Embodiments of the present invention will now be described with reference to the accompanying drawings.

Figure 6:
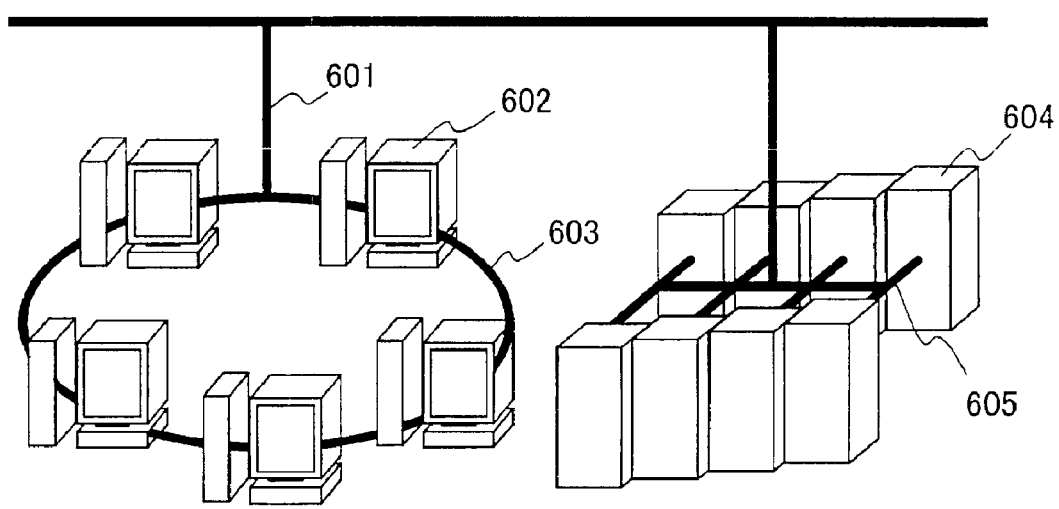
FIG. 6 is a diagram showing an execution environment of the simulation framework.
Figure 7:
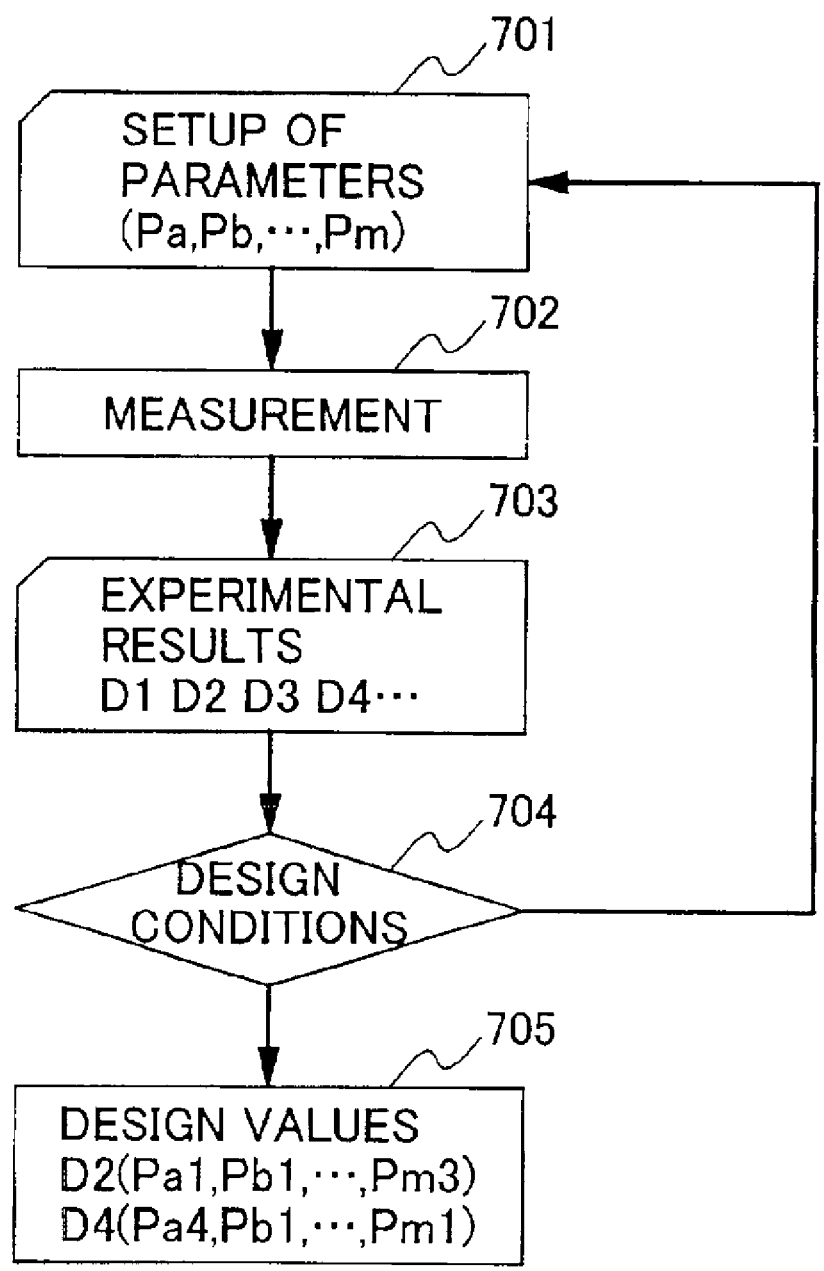
FIG. 7 is a diagram for explaining conventional product design based on trial manufacture.
Figure 8:
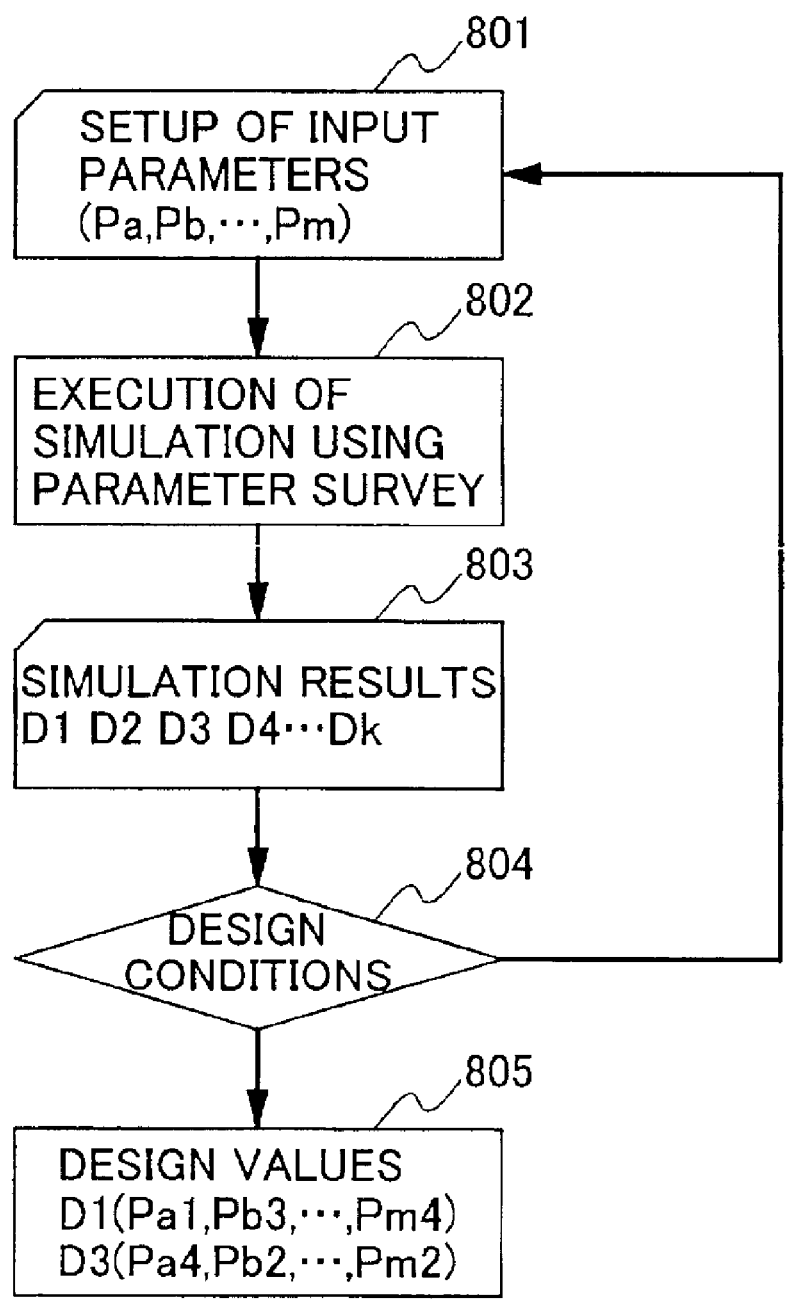
FIG. 8 is a diagram for explaining conventional product design based on simulation.

Referring first to FIG. 6, there is illustrated an execution environment of product design using a simulation framework based on the parameter survey.

It is shown an environment of a parallel distributed execution adapted to execute simulation which is implemented on such hardware under network environment as clusters 603 of work stations 602 connected to Enthernet 601 or a massively parallel computer 604 comprising a number of RISC processors connected to an intercommunication bus 605.

Figure 1:
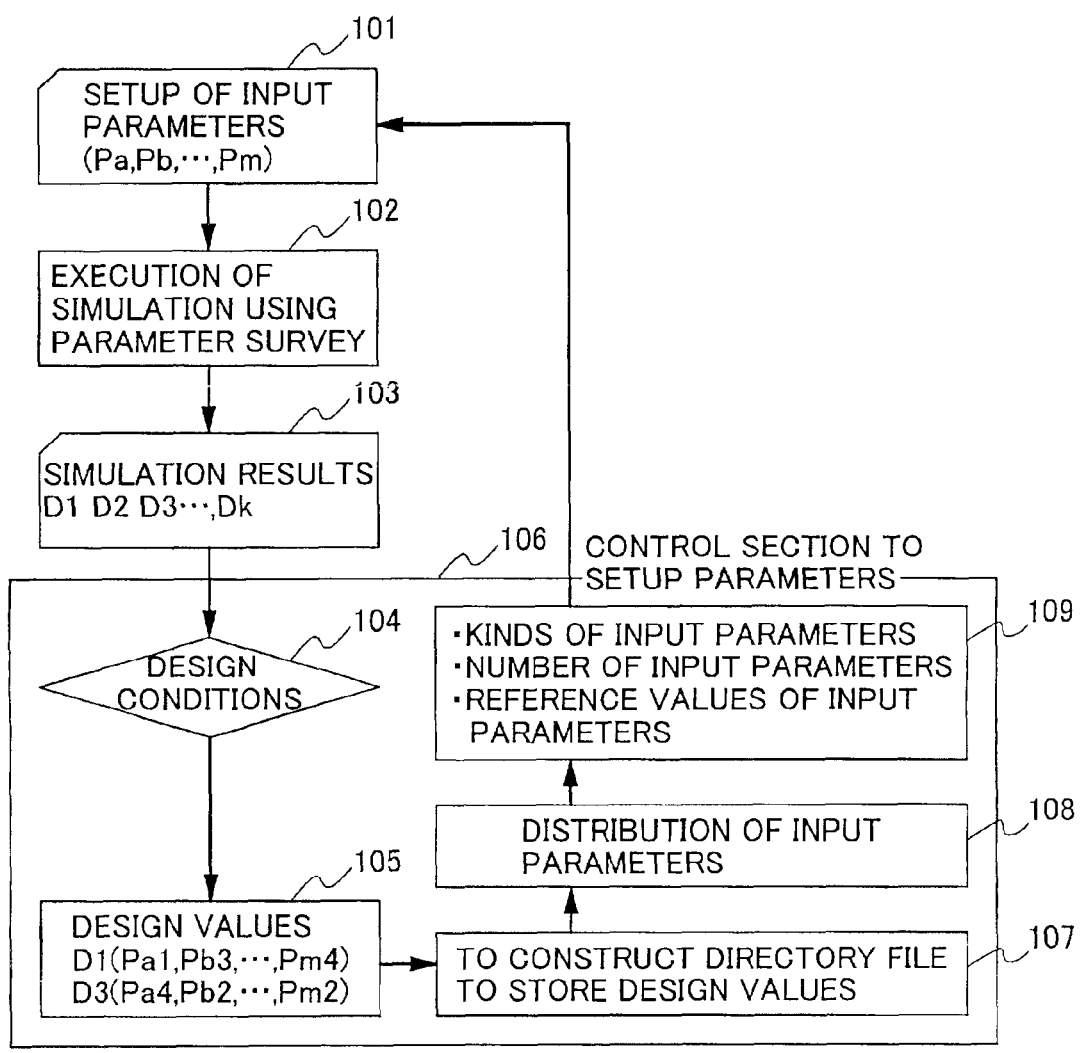
FIG. 1 is a block diagram showing a first embodiment of a construction according to the present invention.

FIG. 1 is a block diagram showing a first embodiment of a construction according to the present invention. In block 101, plural sets of values of input parameters (Pa, Pb, . . . , Pm) representing design objects are set up. Instead of sequentially executing simulations, in block 102, the simulations are simultaneously executed in parallel for the individual values of input parameters on the individual processors of the parallel machines or work station clusters connected to the network. Thereby, simulation results 103 (D1, D2, D3, . . . , Dk) can be obtained at a high speed by the number of processors.

In a control section to set up parameters 106 of the present invention, design values which are the calculation results 103 obtained by executing the simulations are compared with design condition 104 to obtain design values 105 which satisfy the design condition 104. In this case, in place of the calculation results 103 obtained by executing the simulations, design values, which are experimental results obtained through trial manufacture, may be used.

Figure 2:
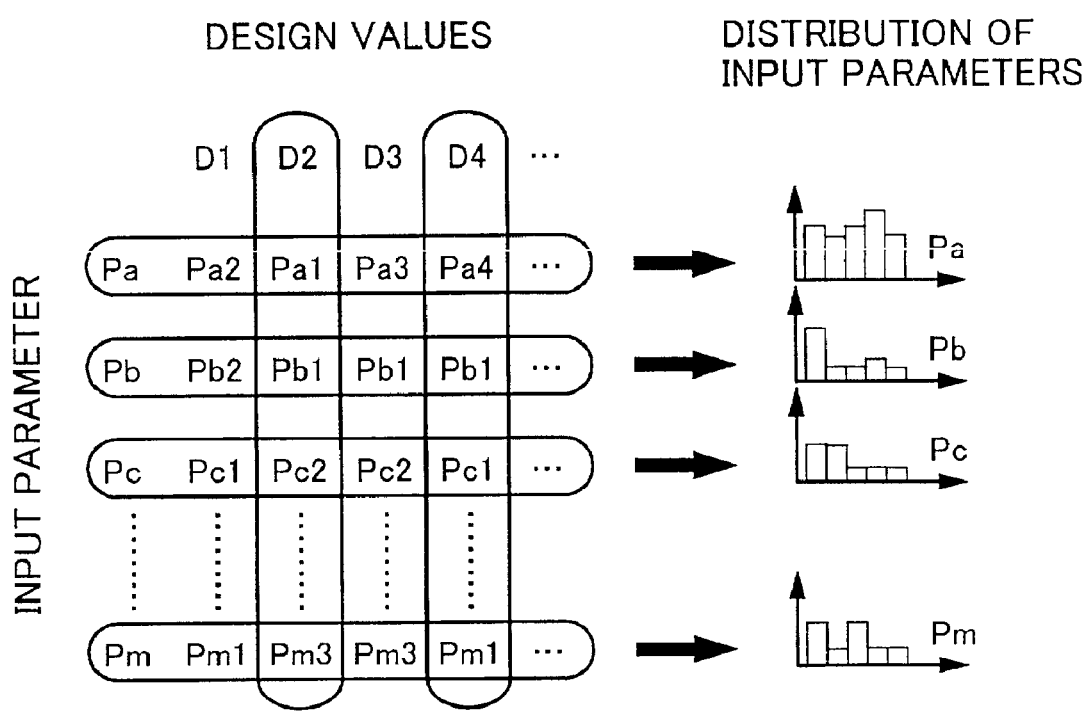
FIG. 2 is a diagram for explaining the totaling of distribution of input values of parameters.

A part of block 108 totaling or accumulating the distribution of the input values of parameters is shown in FIG. 2 in detail. Design value D1 for values (Pa2, Pb2, Pc1, . . . , Pm1) of input parameters (Pa, Pb, Pc, . . . , Pm), design value D2 for values (Pa1, Pb1, Pc2, . . . , Pm3) of input parameters, design value D3 for values (Pa3, Pb1, Pc2, . . . , Pm3) of input parameters, and design value D4 for values (Pa4, Pb1, Pc1, . . . , Pm1) of input parameters are shown.

It is now assumed that design values D2, D4, . . . of design values D1, D2, D3, D4, . . . satisfy the design condition.

Here, for input parameters (Pa, Pb, Pc, . . . , Pm), the input values of parameters satisfying the design condition are plotted on abscissa and the accumulative distribution in the distribution of the input values of parameters are plotted on ordinate. Then, the status of the distribution of the input values of parameters is searched.

The "accumulative distribution" referred to herein is a value indicating how many times the same input value of parameter appears in the distribution of the input values of parameters associated with the plurality of design values. For example, if input value Pb1 of parameter appears x times in design values n, the accumulative distribution becomes x (or $\alpha x$ where $\alpha$ is a coefficient).

In the following, a description will be given on the assumption that the input values of parameters are aligned on abscissa as designated by Pk1, Pk2, Pk3, . . . .

For parameter Pa, the input values of parameters satisfying the design condition are values Pa1, Pa4, . . . , so that they are substantially uniformly distributed to the wide range input values.

For parameter Pb, the input values of parameters satisfying the design condition are values Pb1, Pb1, . . . , so that they are concentrated on the values of the specified parameters. In the distribution shown in the figure, the accumulative distribution of value Pb1 is large.

For parameters Pc and Pm, the input values of parameters satisfying the design condition are distributed to the limited values of parameters (i.e., values Pc1, Pc2, . . . and values Pm1, Pm3, . . . ). Therefore, the accumulative distribution of the input value of the input parameter can be obtained for each of the input parameters.

When a plurality of design conditions must be satisfied, the input values of parameters satisfying the design conditions are plotted on one abscissa and a plurality of design items are plotted on another abscissa. Then, on the two-dimensional plane defined by the two abscissas, the distribution of the input values of parameters are plotted on ordinate. Thereby, the distribution of the input values of parameters are totaled to determine the accumulative distribution.

The input parameters are separated in accordance with the accumulative distribution of the input values of parameters when the parameters are concentrated on the specified values, when they are distributed to the limited input values, or when they are substantially uniformly distributed to the wide range input values.

In the control section to set up parameters 106 shown in FIG. 1, there is block 109 which sets the kind of input parameter, the number of the input values of parameters, and the reference values of the input parameters.

For parameter Pa, the input values of parameters satisfying the design condition are values Pa1, Pa4, . . . , so that they substantially uniformly distribute in the wide range. Therefore, the number of input values of parameters is determined arbitrarily, and input values Pa1, Pa2, . . . , PaN of the present parameters are set as a list of the reference values.

For parameter Pb, the input values of parameters satisfying the design condition are values Pb1, Pb1, . . . , so that they concentrate on the specified value of parameter. Therefore, the input of the parameters is made to be impermissible or the number of input values of parameters is limited to one, and input value Pb1 is set as the reference value.

For parameters Pc and Pm, the input values of parameters satisfying the design condition are values Pc1, Pc2, . . . and Pm1, Pm3, . . . , respectively, so that they distribute to the limited values of parameters. Therefore, the number of input values of parameters is limited to the plural number, and input values Pc1 and Pc2 and input values Pm1 and Pm3 are set as the reference values, respectively.

In this manner, the control section to set up parameters determines the accumulative distribution of input values of parameters when the design values which are the execution results of simulations or the experimental results obtained through trail manufacture satisfy one or more design conditions. Then, the control section to set up parameters controls the kind of input parameter and the number of input values of parameters in accordance with the distribution, and sets the reference values of the input parameters.

Accordingly, in the product design based on the simulations, the kind and number of input parameters representing design objects can be reduced to a great extent.

These set results are presented on the display screen through the input interface as shown in FIG. 3.

For parameter Pb, one input value Pb1 is indicated as the reference value. Further, the input of the parameter is omitted or the number of input values is limited to one.

For parameters Pc and Pm, input values Pc1 and Pc2 of parameters and input values Pm1, Pm3 of parameters are indicated as the reference values, respectively. Further, the number of input values of parameters is made to be the plural number.

For parameter Pa, input values Pa1, Pa2, . . . , PaN of the present parameters are indicated as the list of reference values. Further, the number of input values of parameters are determined arbitrarily.

By proceeding with the input of the parameters in accordance with the input interface, artificial mistakes in the input values of parameters due to manual working operations can be prevented.

The input values of parameters and the design values which are the execution results of simulations are stored according to the following method. The directories of files corresponding to the input values of parameters are constructed in block 107 shown in FIG. 1. Then, a file storing the input values of parameters and the design values which are the execution results of simulations, both of which correspond to the individual directories under the hierarchical structure of directories is automatically constructed.

In directory file /Pb2/Pc1/Pm1/ . . . /Pa2, input values (Pa2, Pb2, Pc1, . . . , Pm1) of the parameters and design value D1 are stored.

In directory file /Pb1/Pc2/Pm3/ . . . /Pa1, input values (Pa1, Pb1, Pc2, . . . , Pm3) of the parameters and design value D2 are stored.

In directory file /Pb1/Pc2/Pm3/ . . . /Pa3, input values (Pa3, Pb1, Pc2, . . . , Pm3) of the parameters and design value D3 are stored.

In directory file /Pb1/Pc1/Pm1/ . . . /Pa4, input values (Pa4, Pb1, Pc1, . . . , Pm1) of the parameters and design value D4 are stored.

The directory name has the one-to-one correspondence relationship to the input values of parameters and the design value thereof.

Figure 4:
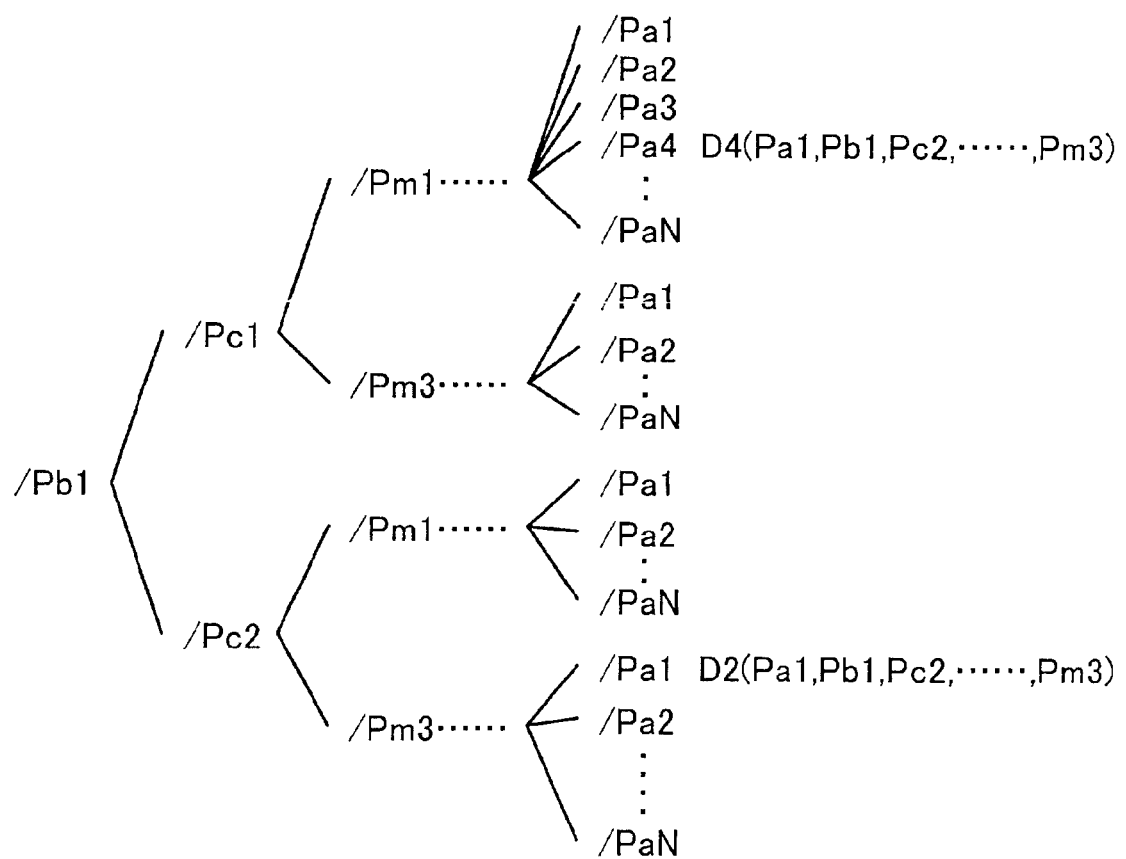
FIG. 4 is a diagram showing a structure of a directory file storing input values of parameters and design values.

Referring to FIG. 4, there is illustrated the directory structure of design values D2 and D4 satisfying the design condition.

Now, in order to total the distribution of input values of parameters, the following method is performed. Design values D1, D2, D3, D4, . . . stored in all of the directories are compared with the design condition. Thereby, it is easy to take out input values (Pa1, Pb1, Pc2, . . . , Pm3) of parameters stored in directory file /Pb1/Pc2/Pm3/ . . . /Pa1 of the design values which satisfy the design condition, and input values (Pa4, Pb1, Pc1, . . . , Pm1) of parameters stored in directory file /Pb1/Pc1/Pm1/ . . . /Pa4 of the design values which also satisfy the design condition, so that it is possible to total the distribution of the input values of input parameters (Pa, Pb, Pc, . . . , Pm).

The foregoing will be explained using a more specified example.

A description will be given by way of example of design of the luminescence efficiency in a plasma display panel (PDP).

Figure 9:
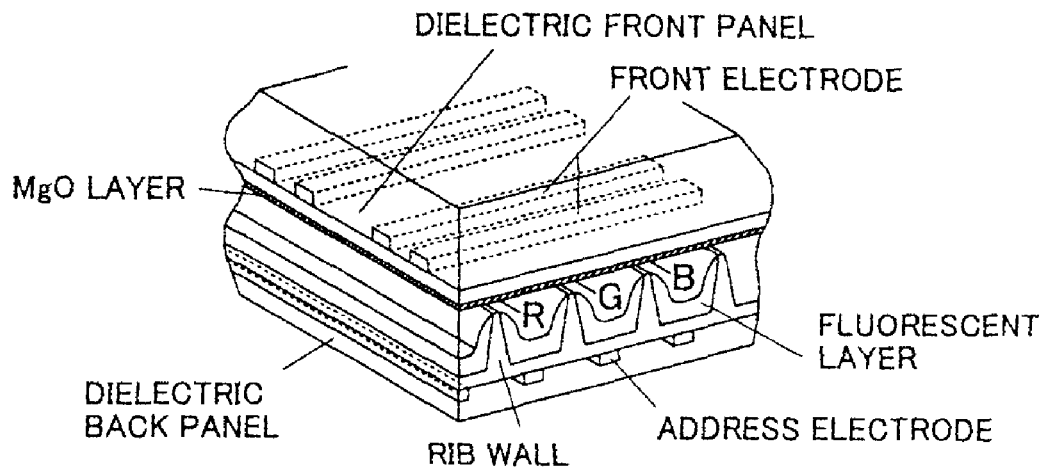
FIG. 9 is a fragmentary perspective view showing a three-dimensional structure of a plasma display panel (PDP).
Figure 10:
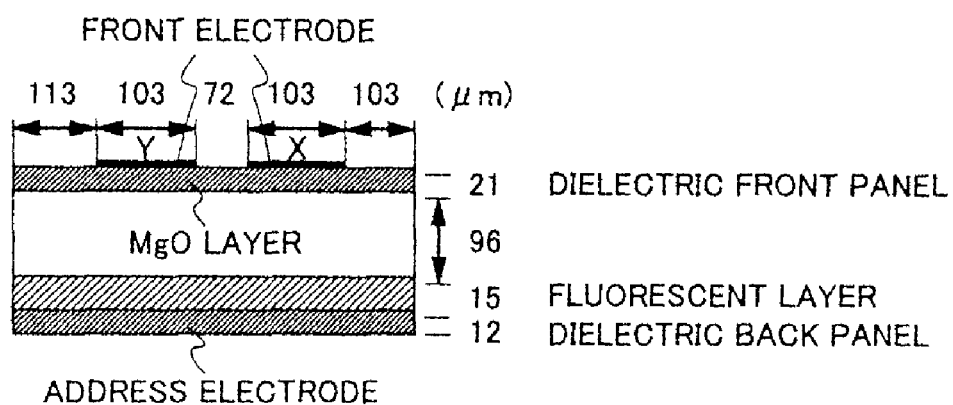
FIG. 10 is a two-dimensional sectional view of the plasma display panel (PDP).

A three-dimensional structure of the PDP is depicted in FIG. 9, and a two-dimensional section of the PDP is depicted in FIG. 10.

Input parameters which are design objects are discharge gap Lg, xy-electrode width Wxy, dielectric width of front panel Lfd, width of fluorescent layer Lp, dielectric width of back panel Lbd and so forth.

The result of the parallel parameter survey is indicated in FIG. 11.

The flow of concrete processing in the control section to set up parameters 106 will now be described.

On the assumption that the design condition 104 is set to the efficiency of not less than 60%, items 5, 7 and 8 shown in FIG. 11 are obtained as the parameter sets corresponding to the design values 105 satisfying the design condition.

In block 108 for determining the accumulative distribution in the distribution of input values of parameters, the distributions of input values shown in FIG. 12 are obtained.

In block 109 for setting the kind of input parameter, the number of input values of parameters and the reference values of the input parameters, two parameter values concentrated are selected as the reference values for Lg.

For Wxy, one parameter value concentrated completely is selected as the reference value.

For Lfd, Lp and Lbd, the parameter values are uniformly distributed, so that the present parameter values are set as the reference values and the number of inputs is set arbitrarily.

In FIG. 13, the GUI screen is shown.

The display of Wxy may be omitted in accordance with user's selection.

In this manner, the control section to set up parameters controls the kind of input parameter and the number of input values of parameters.

A description will now be given on the following two methods. That is, one is a method of presenting a simulation framework to a user or customer, and building up a product design based on the simulation. The other is a method of storing the values of input parameters satisfying the design condition and the design values which are the execution results of the simulations, in a database using the simulation framework to prepare a virtual design database.

Figure 5:
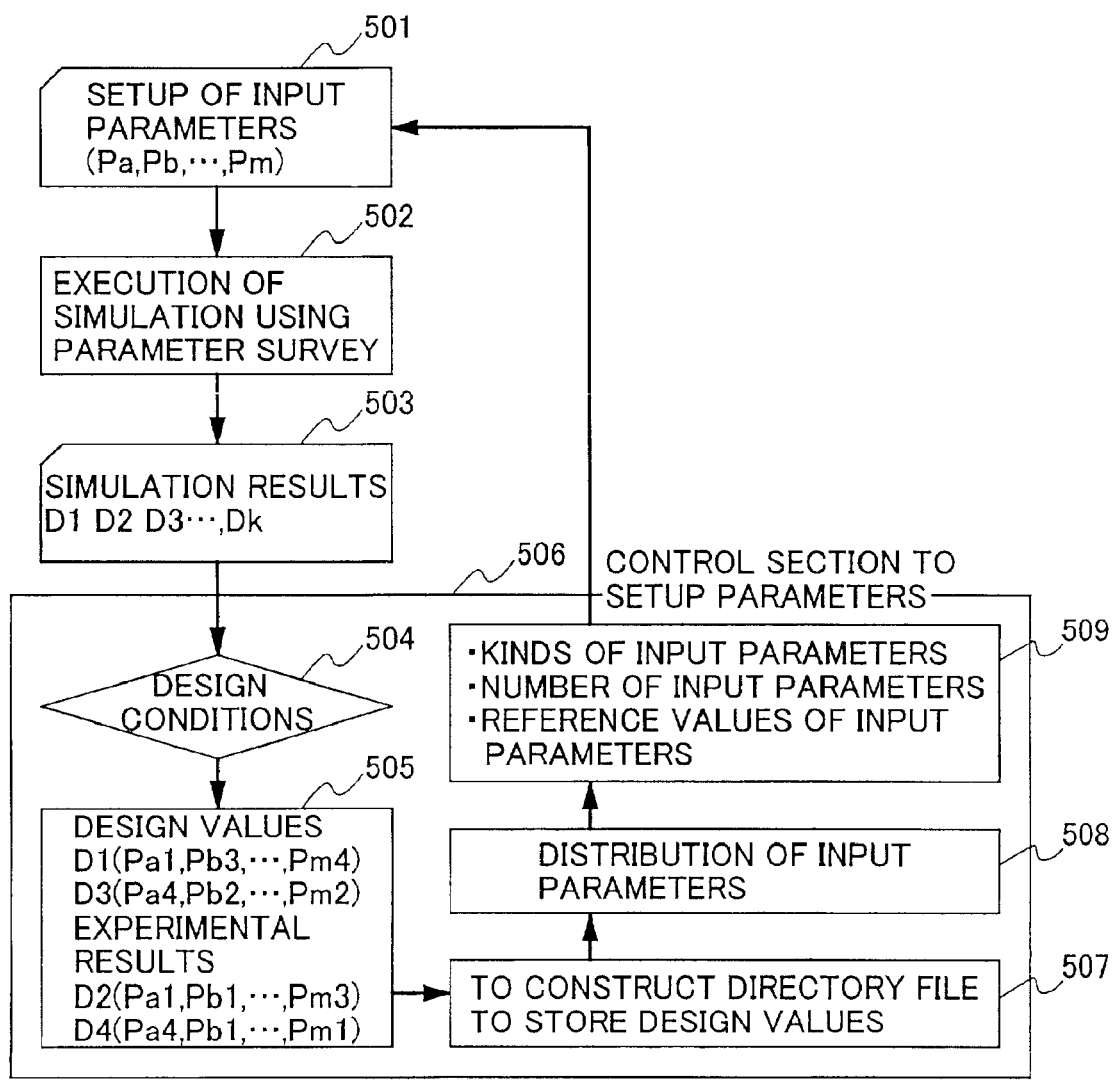
FIG. 5 is a diagram for explaining a build-up method of a simulation framework and a preparation method of a virtual design database.

FIG. 5 is a diagram for explaining the simulation framework build-up method and the virtual design database preparing method.

As shown in FIG. 5, in block 507 for constructing directory files of design values, the directories of files corresponding to the input values of parameters are constructed from the existing experimental results and simulation results 505 of the user and customer. Thereby, a file storing the input values of parameters and the design values which are the execution results of simulations, corresponding to the individual directories under the hierarchical structure of directories is automatically prepared.

Design value D1 and input values (Pa2, Pb2, Pc1, ..., Pm1) of the parameters are stored in directory file /Pa2/Pb2/Pc1/ ... /Pm1.

Design value D2 and input values (Pa1, Pb1,Pc2, ..., Pm3) of the parameters are stored in directory file /Pa1/Pb1/Pc2/ ... /Pm3.

Design value D3 and input values (Pa3, Pb1, Pc2, ..., Pm3) of the parameters are stored in directory file /Pa3/Pb1/Pc2/ ... /Pm3.

Design value D4 and input values (Pa4, Pb1, Pc1, ..., Pm1) of the parameters are stored in directory file /Pa4/Pb1/Pc1/ ... /Pm1.

Next, in block 508 for totaling the input values of parameters satisfying the design condition 504, in connection with input parameters (Pa, Pb, Pc, ..., Pm), the input values of parameters for design values D2, D4, ... satisfying the design condition 504 are plotted on abscissa, and the distributions of input values of parameters are plotted on ordinate. Thereby, the distribution of input values of parameters is searched.

For parameter Pa, the input values of parameters satisfying the design condition are values Pa1, Pa4, ..., so that they are substantially uniformly distributed to the wide range input values. For parameter Pb, they are values Pb1, Pb1, ..., so that they are concentrated on the specified value of parameters. For parameters Pc and Pm, they are values Pc1, Pc2, ... and values Pm1, Pm3, ..., respectively, so that they are distributed to the limited values of parameters. In connection with the individual input parameters, the accumulative distributions of input values of the parameters are searched.

In block 509 for setting the kind of input parameter, the number of input values of parameters and the reference values of the parameters, in accordance with the accumulative distributions of these input values, for parameter Pa, the number of input values of parameters is set arbitrarily, and input values Pa1, Pa2, ..., PaN of the present parameters are set as the list of reference values.

In the input interface, in correspondence to this setting, input values Pa1, Pa2, ..., PaN of the present parameters are indicated as the reference values, and the number of input values of parameters can be set arbitrarily.

For parameter Pb, the input of parameters is made to be impermissible or the number of the input values is limited to one, and input value Pb1 is set as the reference value.

In the input interface, one input value Pb1 is indicated as the reference value, and the input of parameters is omitted or the number of the input values is limited to one.

For parameters Pc and Pm, the number of input values of parameters is limited to the plural number, and input values Pc1 and Pc2 and input values Pm1 and Pm3 are set as the reference values, respectively.

In the user interface, input values Pc1 and Pc2 and input values Pm1 and Pm3 are indicated as the reference values, and the number of input values of parameters can be set to the plural number.

Thus, by reducing the kind of input parameter and the number of input values of parameters and by proceeding with inputting of parameters in accordance with the input interface, artificial mistakes of input values of parameters due to manual working operations can be prevented, and the simulation framework can be built up quickly with ease on the basis of the experimental results and the simulation results of the user or customer.

In FIG. 5, when the design values which are the execution results of simulation 503 do not satisfy the design condition 504, parameters are again set in block 501 using the control section to set up parameters 506, and the parallel parameter survey 502 is repetitively executed until design values satisfying the design condition 504 can be obtained.

In this procedure, a set of files 507 storing the input values of parameters corresponding to the hierarchical structure of the individual directories and the design values which are the execution results of simulations is a virtual design database of the values of input parameters satisfying the design condition 504 and the results of simulations.

According to the present invention, by virtue of the control section to set up parameters, it is possible to solve the problems in the conventional product design based on the simulation using the parallel parameter survey. That is, it is possible to reduce the kind and number of input parameters representing design objects to a great extent. Further, it is possible to prevent artificial mistakes of the input values of parameters due to the manual working operations.

In addition, it is possible to realize the inexpensive and quick optimum design of products instead of the conventional actual trial manufacture.

What is claimed is:

1. An input-parameter setup supporting method in a simulation framework including a processing unit prepared to repeatedly execute a simulation to derive, at each execution time, from a value set of input-parameters, a design value of at least one item which indicates adequacy of said value set of input-parameters, said input-parameter setup supporting method comprising the steps of:

accumulating individual design values which are results of a plurality of past time executions of the simulation and individual value sets of input-parameters used in the past time executions of the simulation;

for each kind of input-parameter, deriving each accumulative value distribution, each reflecting selected value sets of the input-parameters corresponding only to design values which satisfy one or more design conditions, among design values obtained through the past time executions of the simulation, extracting one or more reference values of each input-parameter from each accumulative value distribution;

displaying, for each kind of input-parameter, the extracted reference values and the number of extracted reference values; and permitting a user to set a new value of each of the input-parameters for a next time execution of the simulation within a value range associated to displayed reference values of corresponding input-parameters.

2. An input-parameter setup supporting method according to claim 1, wherein when it is determined that the accumulative distribution for the input value of one parameter in a certain kind of input parameters is concentrated as one value, the input values of parameters in the certain kind of input parameters are fixed to the input value of the one parameter, and a display concerning the certain kind of input parameters is excluded from the display on the input interface.

3. An input-parameter setup supporting method according to claim 1, wherein directories of files corresponding to the input values of parameters are constructed, and wherein a file for storing the design values, which are execution results of the simulation corresponding to the individual directories and the plural kinds of input parameters corresponding to the design values, is constructed under a hierarchical structure of the directories.

4. An input-parameter setup supporting method according to claim 1, wherein other design values obtained as existing experimental results and other plural kinds of input parameters corresponding to the other design values are used in combination with the design values obtained through the simulations and the plural kinds of input parameters corresponding to the design values.

* * * * *